United States Patent [19]

Jinbo

[11] Patent Number: 5,526,309
[45] Date of Patent: Jun. 11, 1996

[54] FLASH MEMORY DEVICE HAVING HIGH SPEED ERASE MODE AND METHOD FOR PERFORMING THE ERASE MODE

[75] Inventor: Toshikatsu Jinbo, Tokyo, Japan

[73] Assignee: NEC Corporation, Tokyo, Japan

[21] Appl. No.: 320,984

[22] Filed: Oct. 11, 1994

[30] Foreign Application Priority Data

Oct. 8, 1993 [JP] Japan .................................. 5-253013

[51] Int. Cl.$^6$ .................................................. G11C 11/34
[52] U.S. Cl. ..................... 365/185.29; 365/218
[58] Field of Search ..................................... 365/185, 218

[56] References Cited

U.S. PATENT DOCUMENTS 5,400,286   3/1995   Chu et al. ............................... 365/218

OTHER PUBLICATIONS

IEEE Solid–State Circuits Council "Journal of Solid–State Circuits", vol. 27, No. 11, (Special Issue on Memory and Logic), Nov., 1992.

Primary Examiner—David C. Nelms
Assistant Examiner—F. Niranjan
Attorney, Agent, or Firm—Popham, Haik, Schnobrich & Kaufman Ltd.

[57] ABSTRACT

A flash memory cell array MC having an array construction of a virtual grounding type wherein a column line B5 on one-end within the array MC is connected to a sense circuit AMP through a N-type MOSFET MV1. On erase verify, a column line B1 on another end is set to ground potential through an N-type MOSFETs MS1 and MS4. By selecting a row line W1, a current flowing from the column line B5 to the column B1 through memory elements M11 to M14 connected to the row line W1 is inspected by a sense circuit AMP, and the memory elements M11 to M14 are erase-verified at the same time.

2 Claims, 7 Drawing Sheets

FLASH MEMORY DEVICE HAVING HIGH SPEED ERASE MODE AND METHOD FOR PERFORMING THE ERASE MODE

BACKGROUND OF THE INVENTION

Field of the Invention

The present invention relates to a birtual grounding type flash memory having a control gate, a drain and a source, which is arranged in rows and columns so that a floating gate field effect transistor capable of electrically writing and erasing information forms an array, and which comprises a plurality of row lines connected to the control gate of the floating gate field effect transistor in each row, and a plurality of column lines connected to the drain or the source of the floating gate field effect transistor in each column.

Figure 7:
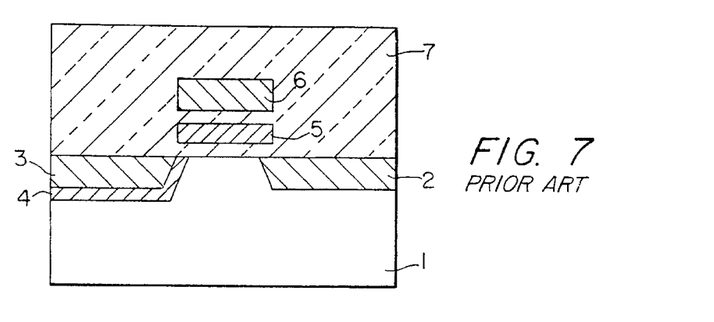
FIG. 7 is a sectional view of a memory element.

A floating gate field effect transistor, which is capable of electrically writing and erasing information (hereinafter referred to as a "memory element"), as shown in FIG. 7, forms a drain difussion layer region 2 and a source difusion layer region 3 by ion injection such as arsenic injection on a P-type substrate 1. The source diffusion layer region 3 is covered by ion injection such as phosphorus injection, to form a source difussion layer region 4 having a lower impurity concentration than the source diffusion layer region 3. In additon, a floating gate 5 on the P-type substrate 1 through silicon oxide film extending as much as 10 mm, and a control gate 6 on the floating gate 5 through a silicon oxide film with an extent of 20 nm or a laminated film of the silicon oxide film and a nitrogen silicon film are provided. An insulating film 7 is grown so as to cover the memory element.

For writing the information into the memory element, a high voltage of up to 12 V is placed on the control gate 6 of the memory element. A high voltage of up to 9 V is placed on the drain 2, the source is set to a ground potential, and electrons are injected into the floating gate 5 by hot carrier injection. As a result, a threshold voltage viewed from the control gate 6 is rendered as a high voltage. To erase the information, the control gate 6 is set to a ground potential, the drain 2 is set to a floating status, a high voltage of up to 10 V is placed on the source, and electrons are injected into the floating gate 5. As a result, a threshold voltage viewed from the control gate 6 is rendered as a low voltage. A high voltage is imposed on the source on erasing; therefore, a withstand voltage on the source portion is improved by providing the source diffusion layer region 4 having a relatively lower impurity concentration in order to cover the source diffussion layer region 3, see FIG. 7.

Figure 8:
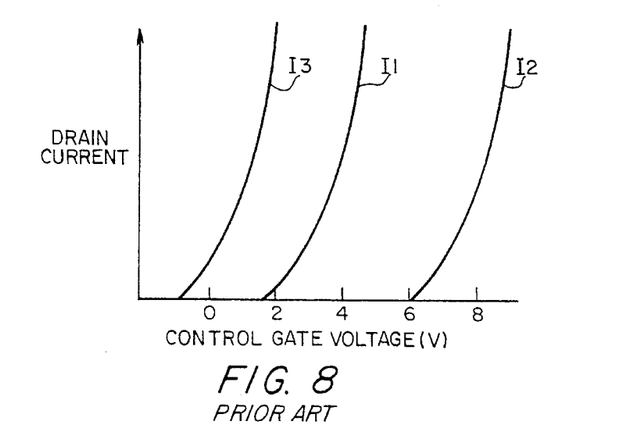
FIG. 8 is a characteristic representation of a memory element.

FIG. 8 is a characteristic of a memory element respectively on write and erase statuses. The memory element on write status is made conductive by a control gate voltage equal to or more than 6 V as shown by solid line I2. The memory element on erase status is made conductive by a control gate voltage of an extent of 2 V as shown by solid line I1. However, the voltage is applied for a long time on the source on erasing. As shown by solid line I3, the control gate such as in a depression transistor becomes conductive at the ground potential, thus requiring control of a voltage-applying time for the source even on erasing.

Figure 9:
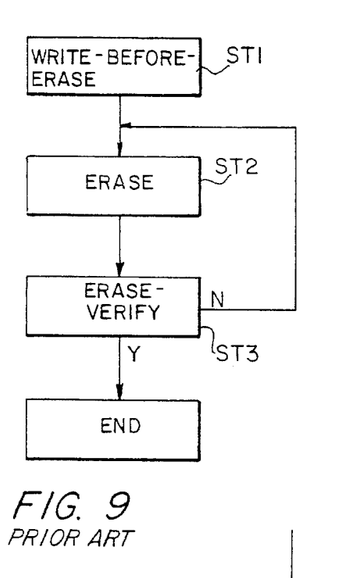
FIG. 9 is a flow chart showing erase operation of a flash memory.
Figure 10:
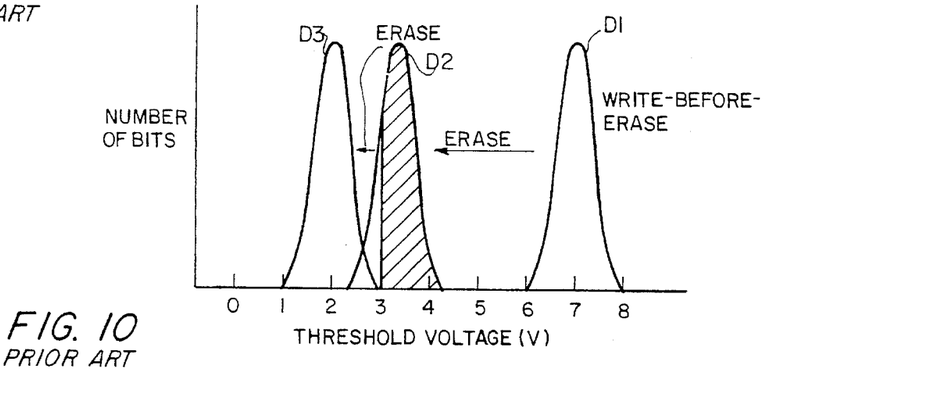
FIG. 10 shows distribution of a threshold voltage of a memory element at the time of erase operation.

In the practical flash memory, a plurality of memory elements, which are arranged in an array shape, are erased at the same time. FIG. 9 is a flow chart showing an actual erasing operation of a flash memory. FIG. 10 shows the distribution of a threshold voltage of a memory element. A series of operations for erasing is described referring to the drawings. In erasing a plurality of memory elements at the same time, different threshold voltages of each memory element before being erased provide disadvantageously a larger distribution of the threshold voltages after being erased. To cope with this, first to equalize the statuses of said plurality of memory elements before the earsing, all the memory elements to be erased are written into and all the threshold voltages are equalized on a high voltage-side, which is called "a write before erase" ST1 (D1 in FIG. 10). In FIG. 8, the high voltage is applied on the source of each memory element to perform an erase ST2. Thereafter, the threshold voltages of each memory element are inspected by an erase verify ST3. In the erase verify ST3, with an ordinary read voltage 5 V being used, a voltage of approximately 3 V or less is suitable for a threshold voltage after erasing the memory elements. As a result of such erase verfication, in cases where memory elements having a threshold voltage equal to or more than 3 V (an oblique lined portion of D2 in FIG. 10) exist as shown by D2 in FIG. 10, an erase ST2 is performed and, thereafter the erase verify ST3 is performed. The erase ST2 and erase verify ST3 are repeatedly performed until all the memory elements come to have a threshold voltage equal to or less than 3 V.

An operation of a flash memory is described showing a practical circuit construction.

Figure 5:
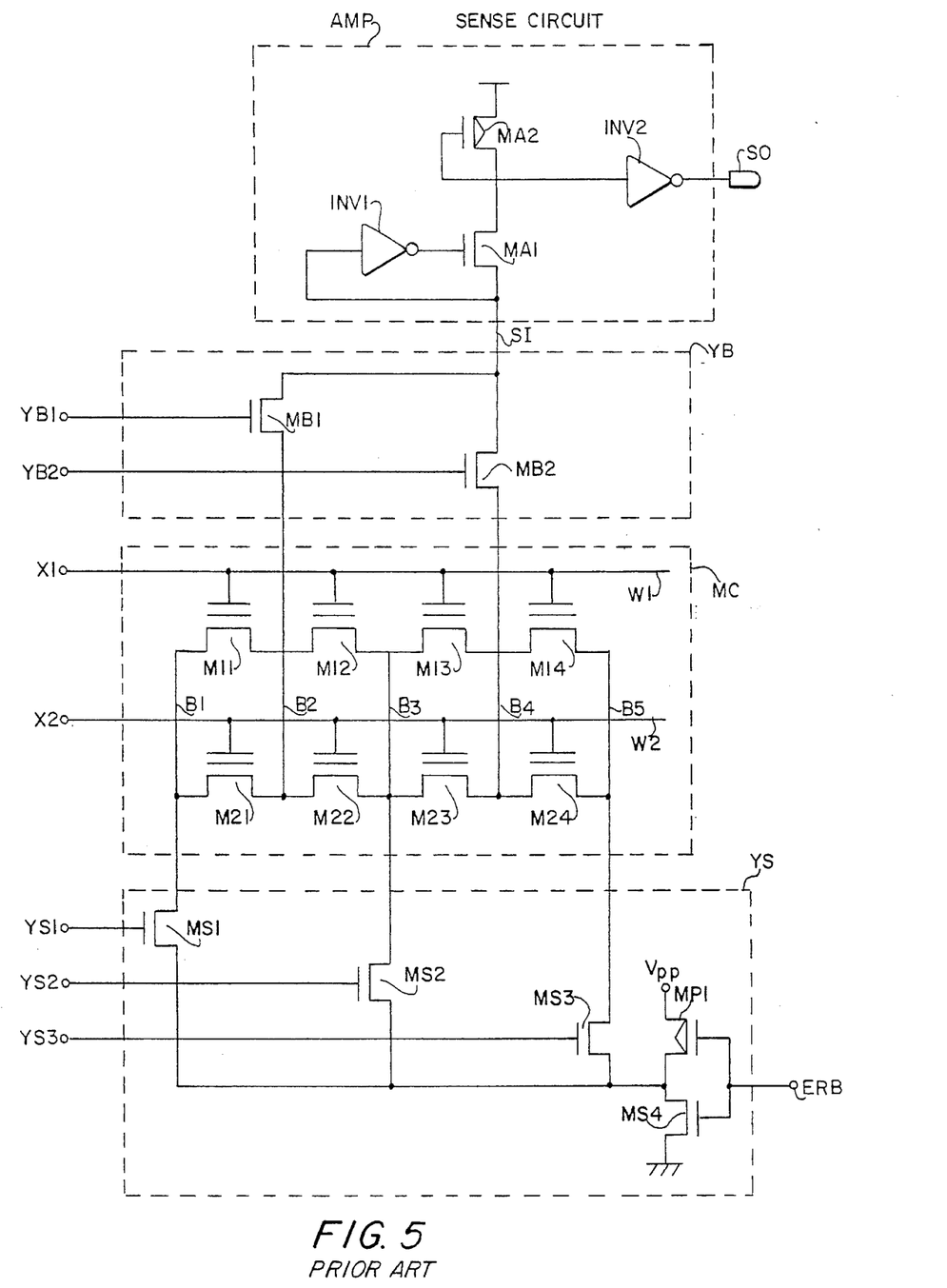
FIG. 5 is a circuit diagram showing the conventional example of the virtual grounding type flash memory.
Figure 6:
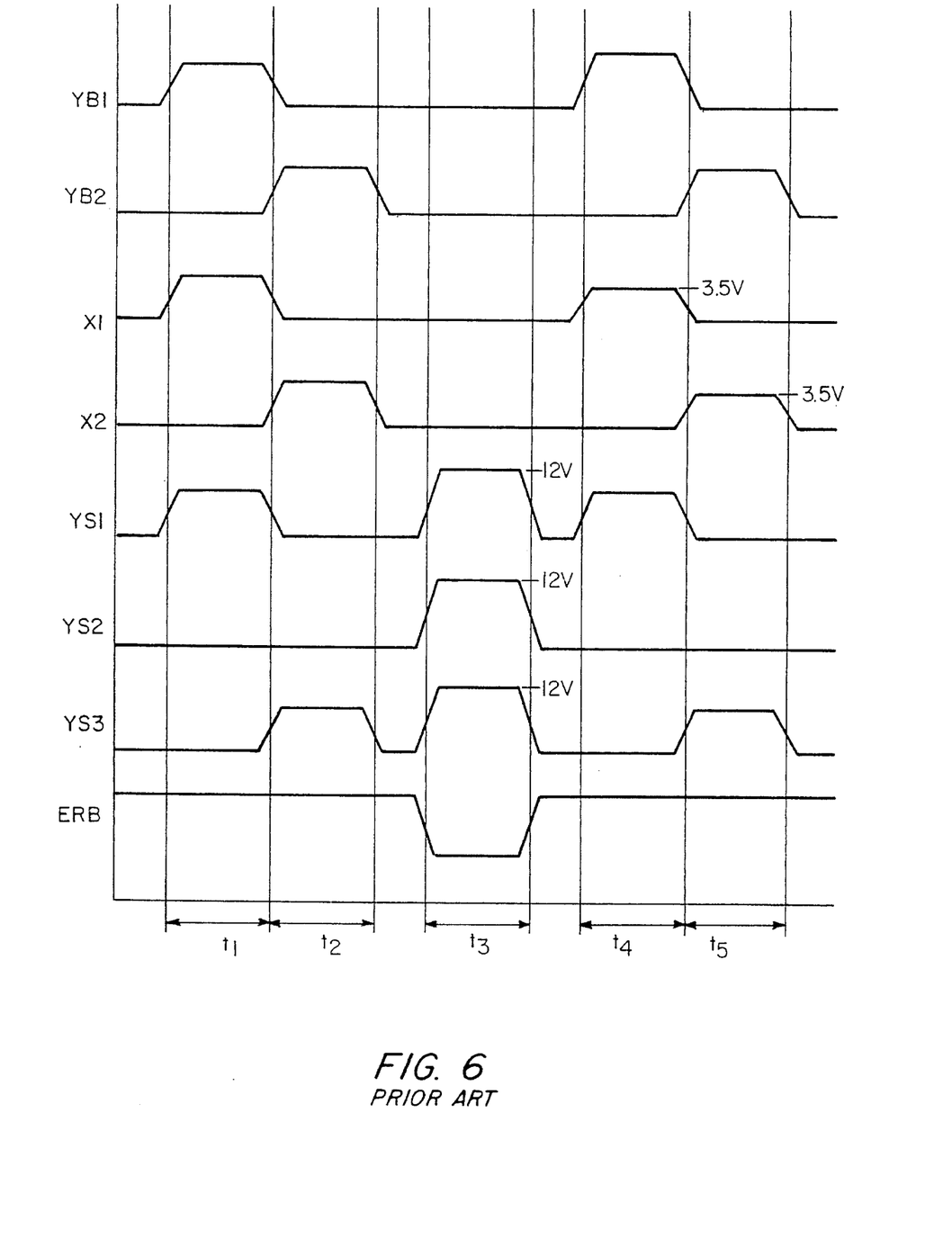
FIG. 6 is a timing chart showing operation of the conventional example in FIG. 5.

FIG. 5 is a circuit diagram of the conventional virtual grounding type flash memory. FIG. 6 is a timing chart showing the operation of the circuit.

In the circuit diagram in FIG. 5, memory elements M11 to M24 constitute a memory array MC, control gates of the memory elements M11 to M14 are connected to a row line W1, the memory elements M21 to M24 are connected to a row line W2 respectively, and the row lines W1 and W2 are controlled by row selecting signals X1 and X2 respectively. Source, drain terminals of each memory element M11 to M24 are connected to corresponding column lines B1 to B5. A column selecting circuit YB is formed by N-type MOSFETs MB1 and MB2, by column selecting terminals YB1 and YB2, either one of the column lines B2 or B4 being selectively connected to a sense circuit AMP. A source selecting circuit YS is formed by N-type MOSFETs MS1 to MS3, P-type MOSFET MP1 and N-type MOSFET MS4. Source selecting signals YS1 and YS3 and a control signal ERB are used to selectively set the column lines B1, B3, B5 to a ground potential or a high voltage. The sense circuit AMP is formed of P-type MOSFET MA2, N-type MOSFET MA1 and inverter circuits INV1 and INV2.

Figure 2:
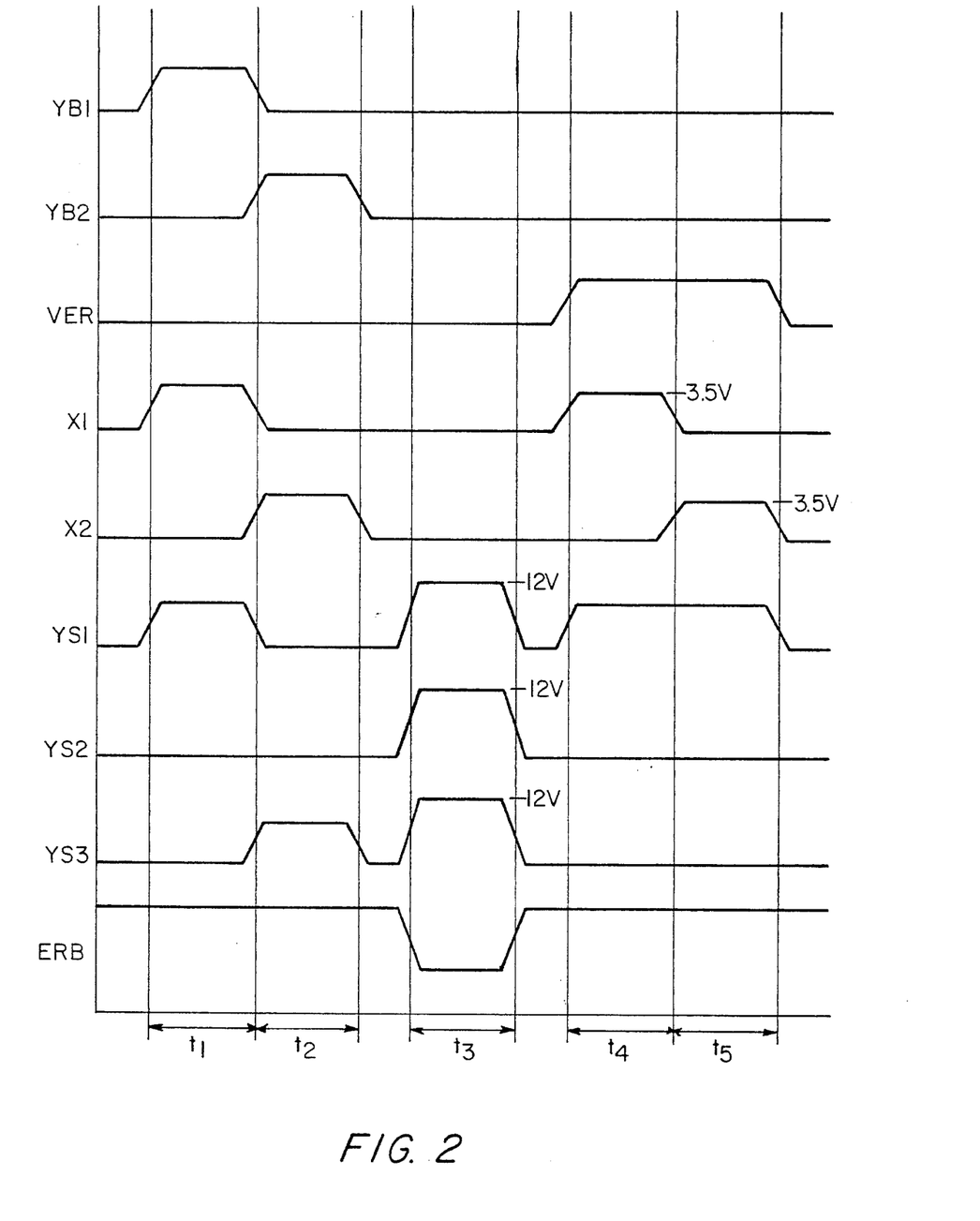
FIG. 2 is a timing chart showing operation of the embodiment in FIG. 1.

The operation of the circuit in each operation mode is described as follows. When reading data, for example, when selecting a memory element M11, as shown in FIG. 6 at t1, the row selecting signal YB1 is set to a high level (for example, 5 V) to render the N-type MOSFET MB1 conductive and to connect the column line B2 to the sense circuit AMP. The row selecting signal X1 is set to a high level (for example, 5 V) to select the row line W1. The source selecting signal YS1 is set to a high level (for example, 5 V) to render the N-type MOSFET MS1 conductive. The control signal ERB is set to a high level (for example, 5 V) to render the N-type MOSFET MS4 conductive. The P-type MOSFET MP1 is made non-conductive to render the row line B1 a ground potential through N-type MOSFET MS1 and MS4. Then power supply $V_{pp}$ of the source selecting circuit YS is of an ordinary high level (for example, 5 V), and the other column lines B3, B4, B5 are in a floating status. In the situation described above, if the memory element M11 is in a write status, no current flows from the column line B2 to the column line B1 through the memory element M11. In addition, the other column lines B3 to B5 are also in a floating status. The column line B2 is then electrically charged through the P-type MOSFET MA2, N-type MOSFET MA1 of the sense circuit AMP and the N-type MOSFET MB1 of the column selecting circuit. As a consequence, an input S1 of the sense circuit AMP is made to a high potential; an output of the inverter circuit INV1 is made to a low potential, where the N-type MOSFET MA1, whose gate is connected to the output of the inverter circuit INV1, comes to non-conductive status. Consequently, an input of the inverter circuit INV2 is electrically charged to a high potential by the P-type MOSFET MA2, and an output so of the sense circuit AMP outputs a low level (for example, 0 V). If the memory element M11 is in a non-write status (or an erase status), a current flows from the column line B2 to the column line B1 through the memory element M11. The column line B2 is discharged to make the input S1 of the sense circuit AMP a low potential, and the output of the inverter circuit INV1 a high potential. The N-type MOSFET MA1 whose gate is connected to the output of the inverter circuit INV1 then comes to a conducting status. Consequently, an input of the inverter circuit INV2 is discharged to be a low potential, and the output S0 of the sense circuit AMP outputs a high level (for example, 5 V). When reading data, for example, in case of selecting the memory element M24, as shown in FIG. 2 at t2, the column selecting signal YB2 is set to a high level (for example, 5 V) to render the N-type MOSFET MB2 conductive and to connect the column line B4 to the sense circuit AMP. The row selecting signal X2 is set to a high level (for example, 5 V) to select the row line W2. The source selecting signal YS3 is set to a high level (for example, 5 V) to render the N-type MOSFET MS3 conductive. The control signal ERB is set to a high level (for example, 5 V) to render the N-type MOSFET MS4 conductive, and the P-type MOSFET MP1 is made non-conductive to render the column line B5 a ground level through the N-type MOSFET MS3 and MS4. At that time, the power supply $V_{pp}$ within the source selecting circuit YS is in an ordinary high level (for example, 5 V), and the other column lines B1, B2, and B3 are in a floating status. Furthermore, for the circuit operation as is the case of selecting the memory element M11, the output S0 of the sense circuit AMP is in a low level (for example, 0 V) with the read status of the memory element M24, and in a high level (for example, 5 V) with non-read status (or erase status) for the same. For write before erase, such read operation is performed with a high voltage for the row lines and column lines of a plurality of memory elements by a procedure as is the case of the known ultraviolet radiation erasable-type programmable ROM (UVPROM).

For the erasing operation, as shown in FIG. 6 at t3, the column selecting signals YB1 and YB2 are set at a low level (for example, 0 V) and the column lines B2 and B4 are in a floating status. The row selecting signals X1 and X2 are set at a low level (for example, 0 V) to render the control gate of each memory element a low level (for example, 0 V). The source selecting signals YS1, YS2, and YS3 and the power supply $V_{pp}$ are set to an erase high voltage (for example, 12 V). The control signal ERB is set to a low level (for example, 0 V), and a high voltage is imposed respectively on the column lines B1, B2 and B5 through the P-type MOSFET MP1 and N-type MOSFET MS1 to MS3, thereby achieving the desired erasing. In this process, assuming that no leakage current is found from the column lines B1, B2 and B5 and 2 V is given to a threshold voltage in consideration of a back bias characteristic of the N-type MOSFET MS1 and MS3, then a voltage applied on the column lines B1, B2 and B3 changes by 10 V (12 V to 2 V). Consequently, the erasing verify reads at every bit basis of memory element by the same means as the ordinary read operation as shown at t4 or t5 in FIG. 6, where a high level of the row selecting signal is generally set to an extent of 3.5 V in order to inspect whether or not the threshold voltage of the memory element is sufficiently low. In the read operation by the erase verify, the memory element is erased the same as in the ordinary read operation, and with the satisfactorily lower threshold voltage, the output S0 of the sense circuit AMP is at a high level (for example, 5 V). This erase verify is performed for each memory element (in this example, performed for an 8 bit memory element) and the erase ST2 and erase verify ST3 in the flow chart in FIG. 9 are repeated until all the memory elements are verified to be erased.

In the conventional virtual grounding type flash memory as described, a long operating time for erase verify is required and occupies a large rate in series of erasing operations. This consequently produces a longer erasing time disadvantageously. In detail, although the erasing itself of the present flash memory requires only as much as 100 m-seconds, 100 verify operations at most are needed because the erase ST2 in FIG. 9 is set to approximately 1 m-second per time in order to prevent the memory element from being in a depression status due to an excess erase. Assuming the memory element erased at the same time is 16 K-bits (16384 bits) and the 16 K-bit memory element is erase verified every time at a rate of 200 n-sec per bit, then 0.3 sec (16384 bits×100 times×200 n-sec) is needed for the erase verify.

To solve this problem, a means of providing a plurality of sense circuits and erase verifying a plurality of memory elements at the same time has been proposed in "A 5-V-Only 16 Mb Flash Memory With Sector Erase Mode" IEEE JOURNAL OF SOLID-STATE CIRCUIT, Volumn 27, Number 11, 1992, pp1547~1554, where a drawback arises in lower productivity and larger dissipation of current in the entire sense circuit because of a larger area for the semi-conductor device due to a plurality of sense circuits provided.

SUMMARY OF THE INVENTION

An object of the invention is provided a virtual grounding type flash memory capable of shortening the time required for an erase verify.

A method of erase verify of a virtual grounding type flash memory according to the invention comprises the steps of, connecting to a read circuit a column line positioned on one end in a plurality of column lines within a array at the time of the erase verify for verifying the erase of the information, connecting the other end column lines to a ground potential, selecting one row line among a plurality of row lines, and detecting a current flowing into a plurality of memory elements in which source/drain current paths connected to the selected row line are connected in seris, whereby the erase verify can be performed at the same time for a plurality of memory elements.

With the plural memory elements being sufficiently erased, a current flows from one-end column line to the other-end column line through these memory element. Even if there exists a memory element with insufficient erase in an amount corresponding to as low as one-bit from among said plurality of memory elements, the erase verify is performed at the same time for the plurality of memory elements without current flow.

Change of the selected row line provides the erase verify at the same time for a plurality of memory elements of the other row lines.

DETAILED DESCRIPTION OF THE PREFERRED EMBODIMENTS

Embodiments according to the invention are described referring to the drawings.

Figure 1:
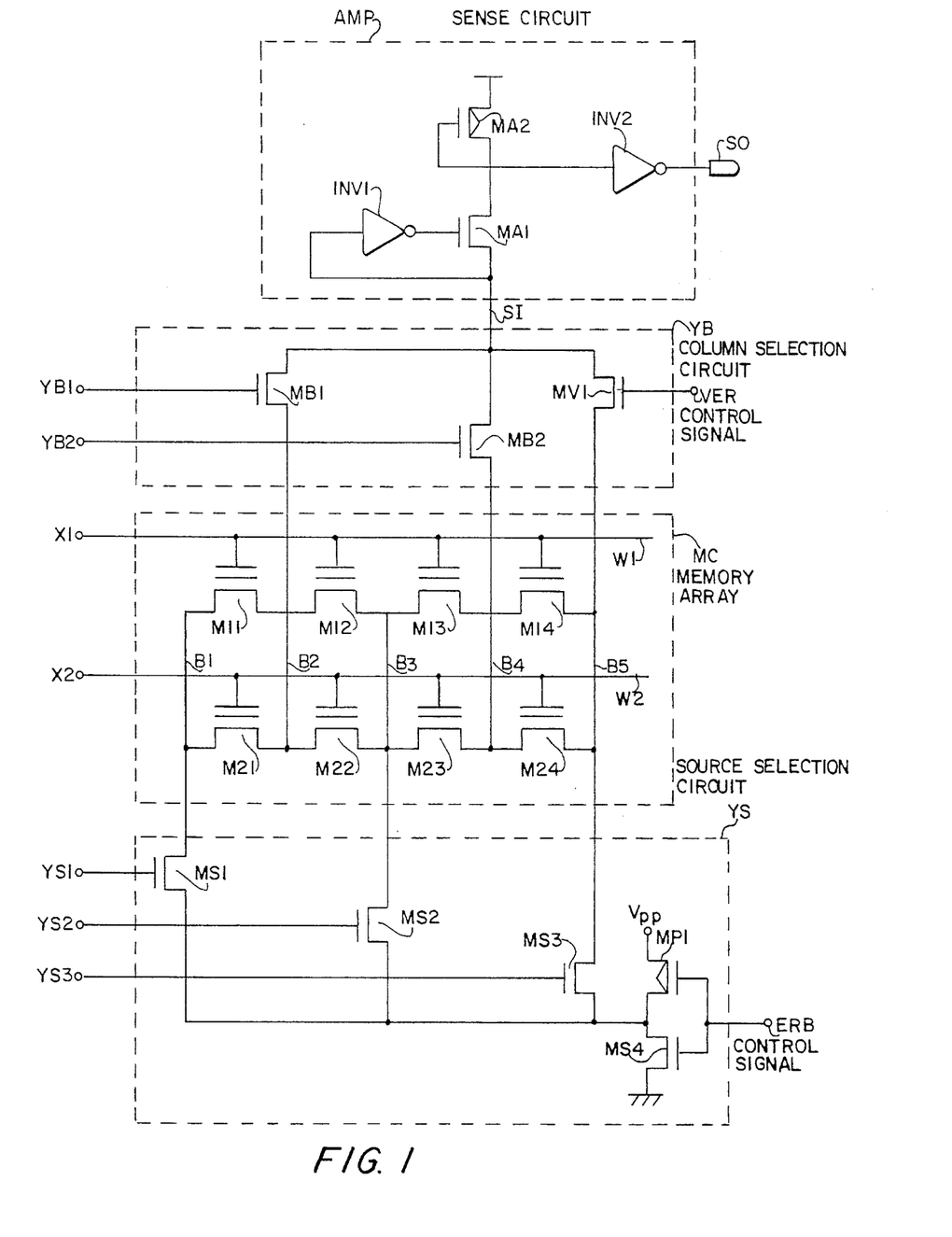
FIG. 1 is a circuit diagram of a virtual grounding type flash memory of one embodiment according to the invention.

FIG. 1 is a circuit diagram of a virtual grounding type flash memory of one embodiment according to the invention, and FIG. 2 is a timing chart showing the operation of the circuit.

Memory elements M11 to M24 constitute a memory array MC, control gates of the memory of elements M11 to M14 are connected to a row line W1, and control gates of the memory elements M21 to 24 are connected to a row line W2 respectively; the row lines W1 and W2 are controlled by row selecting signals X1 and X2. A source terminal and a drain terminal of each memory element M11 to M24 are connected to corresponding column lines B1 to B5. A column selecting circuit YB is formed by N-type MOSFETs MB1, MB2 and MV1. Column selecting signals YB1 and YB2 control the N-type MOSFETs MB1 and MB2, respectively. Either one of column lines B2 or B4 is selectively connected to a sense circuit AMP. A N-type MOSFET MV1 is controlled by a control signal VER to function at the time of erase verify. A source selecting circuit YS is formed by N-type MOSFETs MS1 to MS3 and a P-type MOSFET MP1 and a N-type MOSFET MS4. Source selecting signals YS1 to YS3 and a control signal ERB selectively set the column lines B1, B3 and B5 to a ground potential or a high voltage. The sense circuit AMP is formed of a P-type MOSFET MA2, a N-type MOSFET MA1, and inverter circuits INV1 and INV2.

In the embodiment, in an ordinary read operation or erase operation of data, the control signal VER is at a low level (for example, 0 V) as shown at t1 to t3 in FIG. 2. The N-type MOSFET MV1 is in a non-conductive status, where the operation thereof is the same as in the conventional example as formerly described referring to FIG. 5.

An erase verify operation according to the embodiment is described as follows.

On erase verify, the control signals VER and ERB and the source selecting signal YS1 are set to a high level (for example, 5 V), and the column selecting signals YB1 and YB2 and the source signals YS2 and YS3 are set to a low level, where a power supply $V_{pp}$ within the source selecting circuit YS is in an ordinary high level (for example, 5 V). In this status, when the row selecting signal X1 is assumed as a high level (for example, 3.5 V as in the conventional example), then the memory elements M11 to M14 are selected and simultaneously have the erase verify performed. In detail, the column line B1 is in a ground potential by the N-type MOSFET MS1 and MS2 within the source selecting circuit YS, the column lines B2, B3 and B4 are in a floating status, the column line B5 is connected to the sense circuit AMP through the N-type MOSFET MV1 within the column selecting circuit YB. In this arrangement, a current path from the column line B5 to the column line B1 is formed by memory elements M11 to M14 in which source and drain current paths are connected in series with each other, and if these all memory elements M11 to M14 are completely erased, a current flows from the column line B5 to the column line B1 through the memory elements M11 to M14, the column line B5 is discharged, an input S1 of the sense circuit AMP comes to a low potential, an output of the inverter circuit INV1 comes to a high potential, and the N-type MOSFET MA1 whose gate is connected with the output of the inverter circuit INV1 is in a conductive status. An input of the inverter circuit INV2 is then discharged to b a low potential, an output S0 of the sense circuit AMP comes to a low potential, and the sense circuit outputs a high level of output S0 (for example, 5 V). On the other hand, even if there exists a memory element with insufficient erase in an amount corresponding to one bit among the memory elements M11 to M14, then no current flows from the column line B5 to the column line B1 through the series connected memory elements M11 to M14. The column line B5 is charged through the P-type MOSFET MA2 and N-type MOSFET MA1 of the sense circuit AMP and the N-type MOSFET MV1 within the column selecting circuit YB. As a result an input S1 of the sense circuit AMP is made to a high potential, an output of the inverter circuit INV1 comes to a low potential, and the N-type MOSFET MA1 whose gate is connected with the output of the inverter circuit INV1 comes to non-conductive status. Then, an input of the inverter circuit INV2 is charged by the P-type MOSFET MA2 to be a high potenital. Thus, an output S0 of the sense circuit AMP outputs a low level (for example, 0 V) (see t4 of FIG. 2).

Next, only the row selecting signal is varied to produce a low level (for example, 0 V) of the row selecting signal X1 and to produce a high level (for example, 3.5 V as in the conventional example) of the row selecting signal X2. It is thereby possible to erase verify the memory elements M21 to M24 at the same time (see t5 in FIG. 2).

In this way, according to the present embodiment, a simultaneous erase verify of a plurality of memory elements at every row line unit basis provides a shortened time of the erase verify. In addition, to realize this function, circuits and the like added as a result in comparison with the conventional example are only in the N-type MOSFET MV1 and the control signal VER. Therefore, an increase of area for semiconductor devicesis negligibly small, and the increase of dissipated current in the sense circuit AMP is eleminated.

In this embodiment, 4 bit memory elements arranged on the same line are erased verified at the same time. However, according to the invention, it is possible to increase the number of memory elements on the same row line and to erase verify a higher number of memory elements (for example, 8 bits or 16 bits) at the same time.

Figure 3:
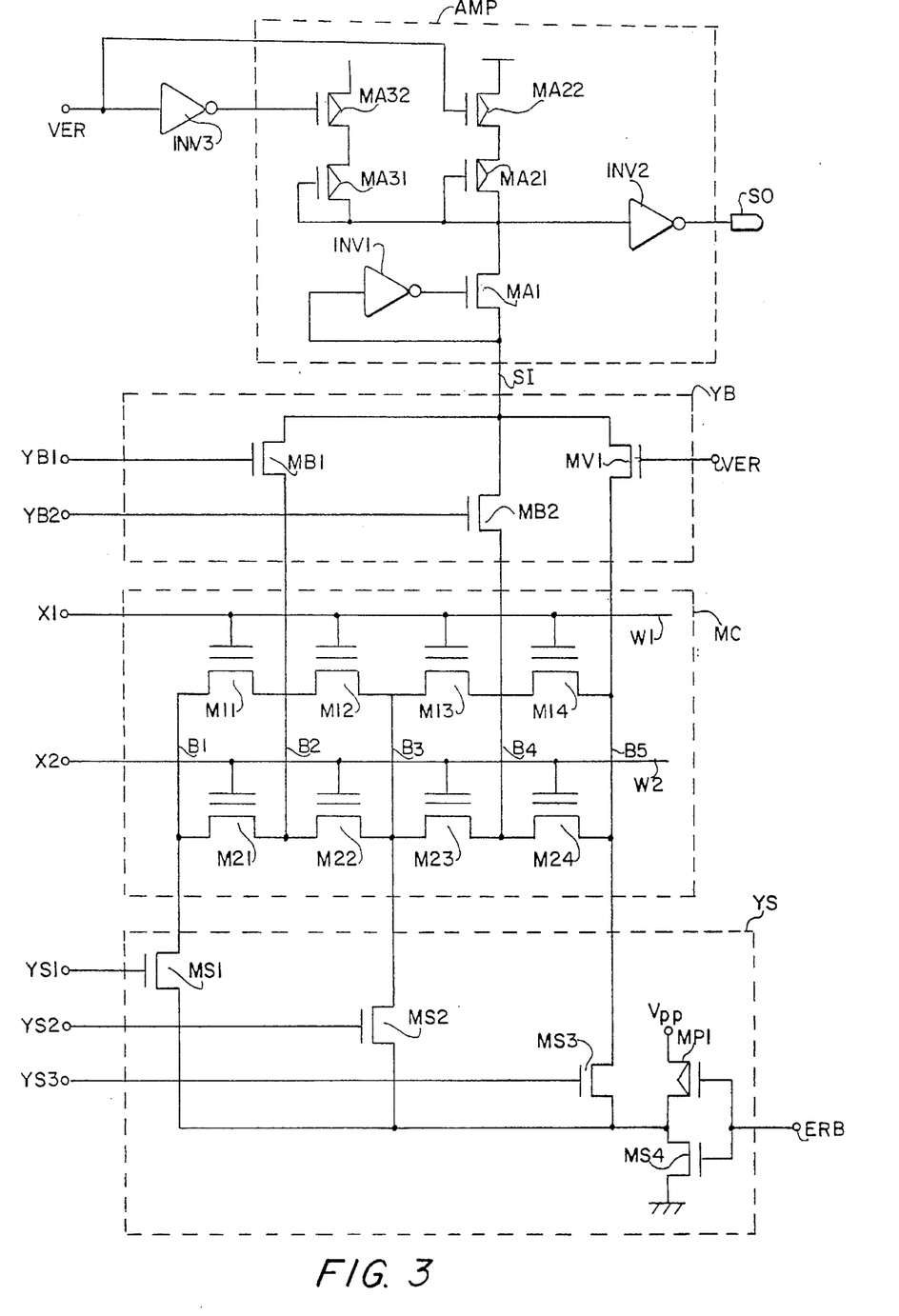
FIG. 3 is circuit diagram of a virtual grounding type flash memory of another embodiment according to the invention.

In the embodiment shown in FIG. 1, the same sense circuit is used for an ordinary read operation, namely one bit read, and for a read operation on erase verify. However according to the invention, it is difficult some times for the sense circuit AMP to detect a reduced current flowing into the memory element because a plurality of bits of memory elements are connected in series with each other on read operation on the erase verify. An improved read of the sense circuit AMP on such erase verify is shown in FIG. 3 as a circuit diagram of another embodiment, and a timing chart showing the operation of this embodiment described is shown in FIG. 4.

In this embodiment, only the constitution of the sense circuit AMP is different from the embodiment shown in FIG. 1. The sense circuit AMP is formed of P-type MOSFET MA21 and MA22 connected in series with each other, P-type MOSFETs MA31 and MA32 similarly connected in series with each other, the N-type MOSFET MA1, and the inverter circuits INV1 and INV2, where gates of the P-type MOSFETs MA22 and MA32 are controlled by the control signal VER and an inverter circuit INV3.

In this embodiment, on the ordinary read operation, the control signal VER is in a low level (for example, 0 V), the P-type MOSFET MA22 is in a conductive status, the P-type MOSFET MS32 is in a non-conductive status, and thus a function corresponding to the P-type MOSFET MA2 in FIG. 1 is realized by the P-type MOSFET MA21 and MA22 connected in series with each other.

Figure 4:
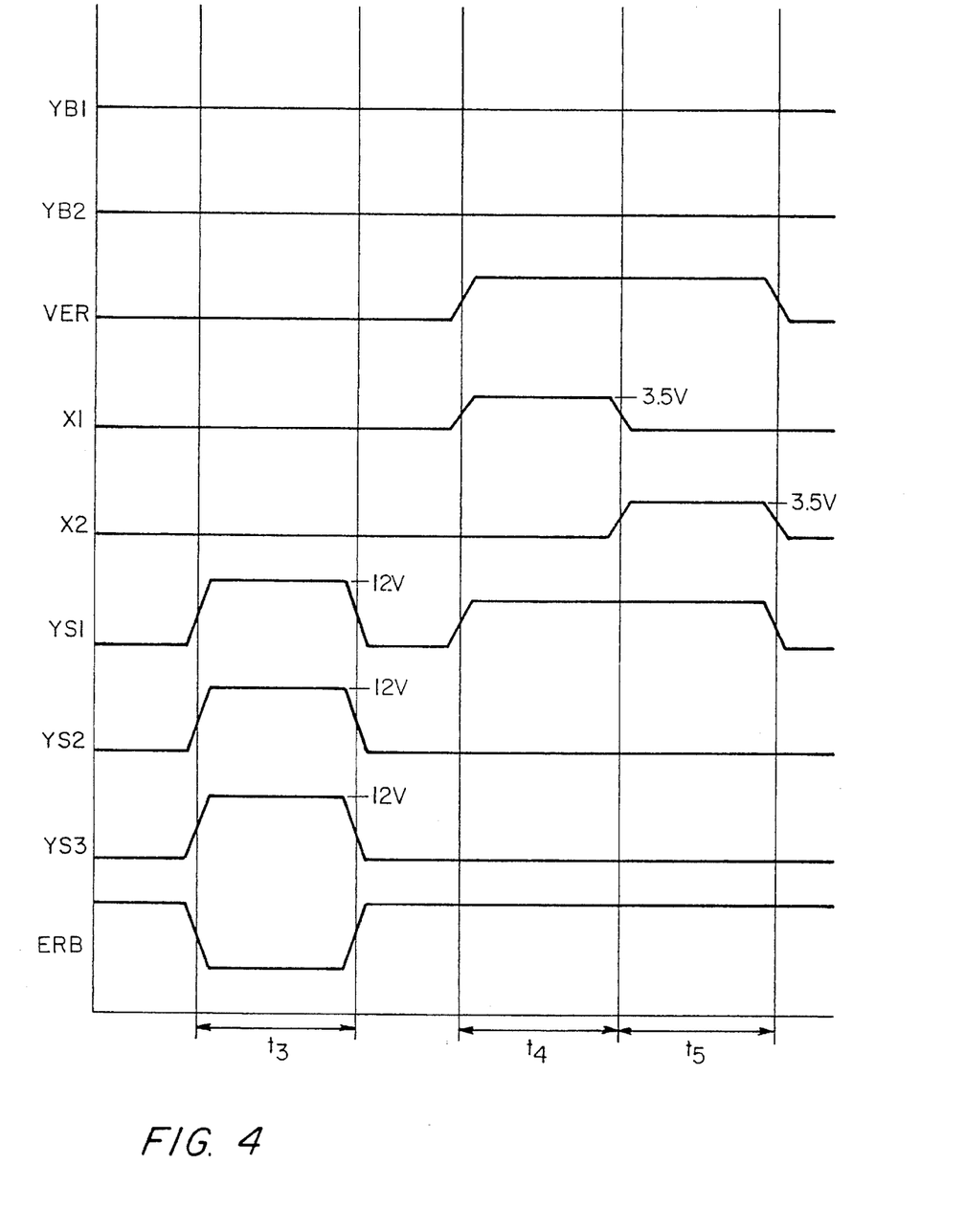
FIG. 4 is a timing chart showing operation of the embodiment in FIG. 3.

On the erase verify, as shown at t4 and t5 in FIG. 4, the control signal VER comes to a high level (for example, 5 V), and thus the P-type MOSFET MA22 within the sense circuit AMP is in a non-conductive status. The P-type MOSFET MA32 is in a conductive status, thus realizing a function corresponding to the P-type MOSFET MA2 in FIG. 1 by the P-type MOSFETs MA31 and MA33 connected in series with each other.

Therefore, in effect, a read operation on the erase verify can be made more stable, wherein in case of an ordinary read operation, namely reading 1 bit, there can be realized the setting of an optimum load transistor by the P-type MOSFETs MA21 and MA22. On the other hand, in the case of a read operation on the erase verify, namely on serial read of the plural bits, there can be realized the setting of an optimum load transistor by the P-type MOSFETs MA31 and MA32.

As hereinbefore fully described, the present invention, in a virtual grounding type flash memory, comprises the steps of, connecting to a read circuit a column line positioned on one-end in a plualty of column lines within an array at the time of the erase verify for verifying the erase of the information, connecting the other end column lines to a ground potenital, selecting one row line among a plurality of row lines, and detecting a current flowing into a plurality of memory elements which is connected to the selected row lines and in which a source current path and a drain current path are connected in series with each other, thereby the erase verification can be performed at the same time for a plurality of memory elements. As a result, the required time for the erase verify is shortened effectively. For example, consider a case where a cycle of erasing and erase verify is repeated 100 times. In the conventional virtual grounding type flash memory, 0.3 sec (16384 bits×100 times×200 n-sec) is needed for the erase verify in the conventional method of erase verify under the condition that the memory erased at the same time is 16 K-bits (16384 bits) and the 16 K-bit memory element is erase verified every time at a rate of 200 n-sec per bit. However in the present invention, for example, with a four bit simultaneous erase verify being performed, only 0.08 seconds (16384 bit÷4 bits×100 times× 200 n-sec) are needed. Therefore, time savings up to 75% may be achieved.

What is claimed is:

1. A flash memory device comprising a plurality of word lines each coupled to control gates of associated ones of a plurality of floating gate type field effect transistors which are electrically programmable and erasable floating gate type field effect transistors and arranged in rows and columns to form a matrix, a plurality of first column lines each coupled to one of source and drain of each of associated ones of the floating gate type field effect transistors and selectively coupled to a read out circuit during a read out operation, a plurality of second column lines each coupled to the other of the source and drain separately from said first column lines and selectively coupled to a reference potential, and a connection circuit controlled by an external control signal during an erase-verifying operation for verifying erasing of information to connect one of said second column lines in the array to said reference potential and to further connect to another one of said second column lines to said read out circuit.

2. The flash memory device as claimed in claim 1, wherein said read out circuit includes an auxiliary read out circuit controlled by said external control signal and activated during the the erase-verifying operation.

* * * * *